United States Patent
Schaefer et al.

(10) Patent No.: US 6,917,562 B2
(45) Date of Patent: Jul. 12, 2005

(54) SEMI-CONDUCTOR COMPONENT WITH CLOCK RELAYING DEVICE

(75) Inventors: Andre Schaefer, Munich (DE); Johann Pfeiffer, Ottobrunn (DE); Kazimierz Szczypinski, München (DE)

(73) Assignee: Infineon Technologies AG, Munich (DE)

( * ) Notice: Subject to any disclaimer, the term of this patent is extended or adjusted under 35 U.S.C. 154(b) by 113 days.

(21) Appl. No.: 10/658,741

(22) Filed: Sep. 10, 2003

(65) Prior Publication Data

US 2004/0124886 A1 Jul. 1, 2004

(30) Foreign Application Priority Data

Sep. 24, 2002 (DE) .......................................... 102 44 401

(51) Int. Cl.$^7$ .............................................. G11C 7/00
(52) U.S. Cl. ..................................... 365/233; 365/194
(58) Field of Search ................................ 365/233, 194; 327/299

(56) References Cited

U.S. PATENT DOCUMENTS

| | | | |
|---|---|---|---|
| 6,292,403 B1 * | 9/2001 | Pancholy et al. ...... | 365/189.05 |
| 6,385,128 B1 * | 5/2002 | Arcoleo et al. ............. | 365/233 |
| 6,407,591 B1 | 6/2002 | Wong et al. | |
| 6,424,555 B1 | 7/2002 | Chang | |
| 2001/0043099 A1 | 11/2001 | Kawasaki et al. | |

* cited by examiner

Primary Examiner—Vu A. Le
(74) Attorney, Agent, or Firm—Banner & Witcoff, Ltd.

(57) ABSTRACT

The invention involves a component with a connection (3b), as well as at least one further connection (3a), whereby differential input clock pulses (CLK, CLK$_T$; /CLK, /CLK$_T$) can be applied to the connections (3a, 3b), or a single input clock pulse (CLK, CLK$_T$) applied to the connection (3b) and/or to the further connection (3a)—, and where the component in addition has a first and a second pulse relay device (50, 51), where the first pulse relay device (50) has been provided for relaying differential input clock pulses (CLK, CLK$_T$; /CLK, /CLK$_T$), and the second pulse relay device (51) for relaying a single input clock pulse (CLK, CLK$_T$).

20 Claims, 2 Drawing Sheets

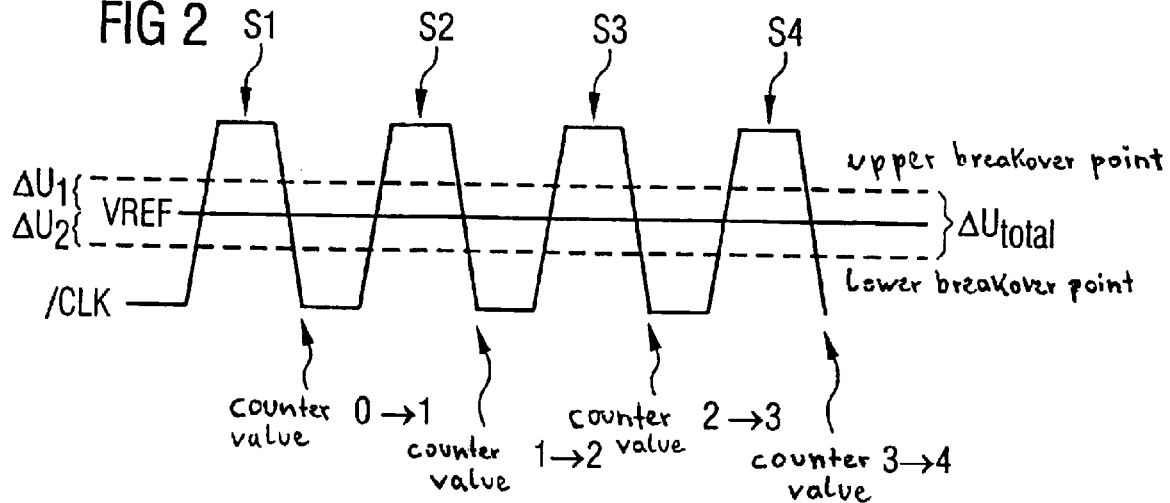
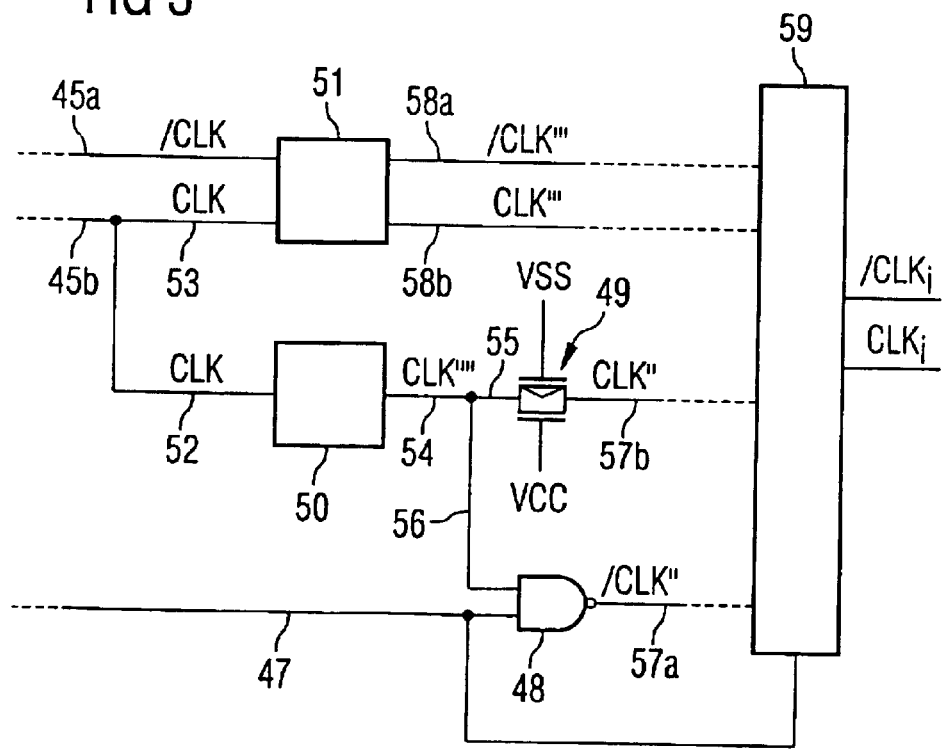

SEMI-CONDUCTOR COMPONENT WITH CLOCK RELAYING DEVICE

The invention relates to a component according to the preamble of claim 1, more particularly a DDR (Double Data Rate) semi-conductor component.

In semi-conductor components, more particularly memory components such as DRAMs (DRAM=Dynamic Random Access Memory and/or dynamic read/write memory) based on CMOS technology, so-called clock pulses are used for the chronological co-ordination of the processing and/or relaying of data.

Conventional semi-conductor components use one "single-ended" clock pulse, present on a single line, for this purpose.

The data may then for instance be relayed at any time by means of the ascending pulse flank of the single-ended clock pulse (or alternatively at any time for instance by means of the descending pulse flank of the single-ended clock pulse).

In conventional technology so-called DDR components, more particularly DDR-DRAMs (DDR-DRAM=double data rate DRAMs and/or DRAMs with a double data rate) are already well known.

In DDR-DRAMs, two differential, inverse clock pulses present on two separate lines are used, instead of one single clock pulse ("single ended" clock pulse) present on a single line.

Every time, for instance, when the first of the two clock pulses changes from a "high logic" state (i.e. a high voltage level) to a "low logic" state (i.e. a low voltage level), the second clock pulse—essentially simultaneously—changes its state from "low logic" to "high logic" (e.g. from a low to a high voltage level).

Conversely, whenever the first clock pulse changes from a state of "low logic" (e.g. from a low voltage level) to a state of "high logic" (e.g. a high voltage level), the second clock pulse (again essentially simultaneously) changes its state from "high logic" to "low logic" (e.g. from a high to a low voltage level).

With DDR-DRAMs, data is relayed by both the ascending flank of a particular clock pulse and the descending flank of the same clock pulse.

This means that data is relayed more frequently and/or faster (more particularly, twice as frequently and/or twice as fast) with a DDR-DRAM relaying the data, than with corresponding conventional DRAMs using "single ended" clock pulses; in other words the data rate of DDR-DRAMs is twice as high as that of corresponding current DRAMs.

DDR-DRAMs contain two pulse connections and in the normal operating mode of a DRAM, the above-mentioned first clock pulse—generated by an external clock pulse trigger—is applied to the first pulse connection of the DRAM, and the second dock pulse, also generated by the external clock pulse trigger but inverted in relation to the first clock pulse—is applied to the second pulse connection.

When the DDR-DRAM is tested before being put into use (i.e. when it is operated in test mode instead of in the normal operating mode), for instance by means of a special external test apparatus, the relevant clock pulses—instead of being generated by an external dock pulse trigger—are generated by an external test apparatus and applied to the relevant DRAM connections.

Thereby the above-mentioned differential test clock pulse generated by the test apparatus—corresponding with the relevant differential dock pulse—can be applied to the corresponding first and second pulse connections of the DDR components, or alternatively the test apparatus may simply generate one single-ended test clock pulse, corresponding with a clock pulse from a current component using only one single clock pulse.

This single test clock pulse is, for example, simply applied to the first pulse connection of the DRAMs (at the second component pulse connection there will then be no (test) clock pulse present, but for instance a voltage, Vref; this voltage is needed for operating the DDR-DRAMs, i.e. it must be supplied by the test apparatus and may be applied during the test to the second pulse connection as well).

By using one single test clock pulse (instead of the above two inverted test clock pulses) test channels can be spared in the corresponding test apparatus being used.

Apart from this, it becomes possible for a test apparatus designed for testing currently available components and using one single-ended clock pulse (or a similar and/or corresponding test apparatus) to be used for testing DDR-DRAMs designed to be tested by differential test clock pulses.

This invention is aimed at providing a novel component for this purpose.

These and other aims are achieved by means of the subject matter of claim 1.

Further advantageous developments of the invention are listed in the subsidiary claims.

According to a basic concept of the invention, a component is provided that has one (first) connection, as well as at least one further connection, whereby differential input clock pulses (CLK; /CLK) may be applied to the connections, or one single input clock pulse (CLK) to the (first) connection, and where the component also has one first and one second pulse relay device, whereby the first pulse relay device is used for relaying differential input clock pulses (CLK; /CLK), and the second pulse relay device for relaying a single input clock pulse (CLK).

It is especially advantageous that the first pulse relay device has been specifically designed to relay differential input clock pulses (CLK; /CLK), and/or the second pulse relay device specifically for relaying a single input clock pulse (CLK).

In this way—depending on the nature of the clock pulse and/or input clock pulse (differential or "single-ended")— the corresponding relay device optimized at any time for the relevant input clock pulse, may be put into use or activated (and the other pulse relay device deactivated).

In this way improved, more particularly faster, relaying of the input clock pulse is achieved than with current technology (where one and the same pulse relay device is used, regardless of whether differential or "single ended" input clock pulses are to be relayed).

The invention is more closely described below with the use of an embodiment example and an accompanying illustration. In the illustration:

FIG. 2 shows a schematic representation of the chronological progress of the reference voltage used in the clock pulse detection device according to FIG. 1e, and of the clock pulse to be detected; and FIG. 3 shows a schematic representation of a further section of the circuit device illustrated in FIG. 1.

Figure 1:
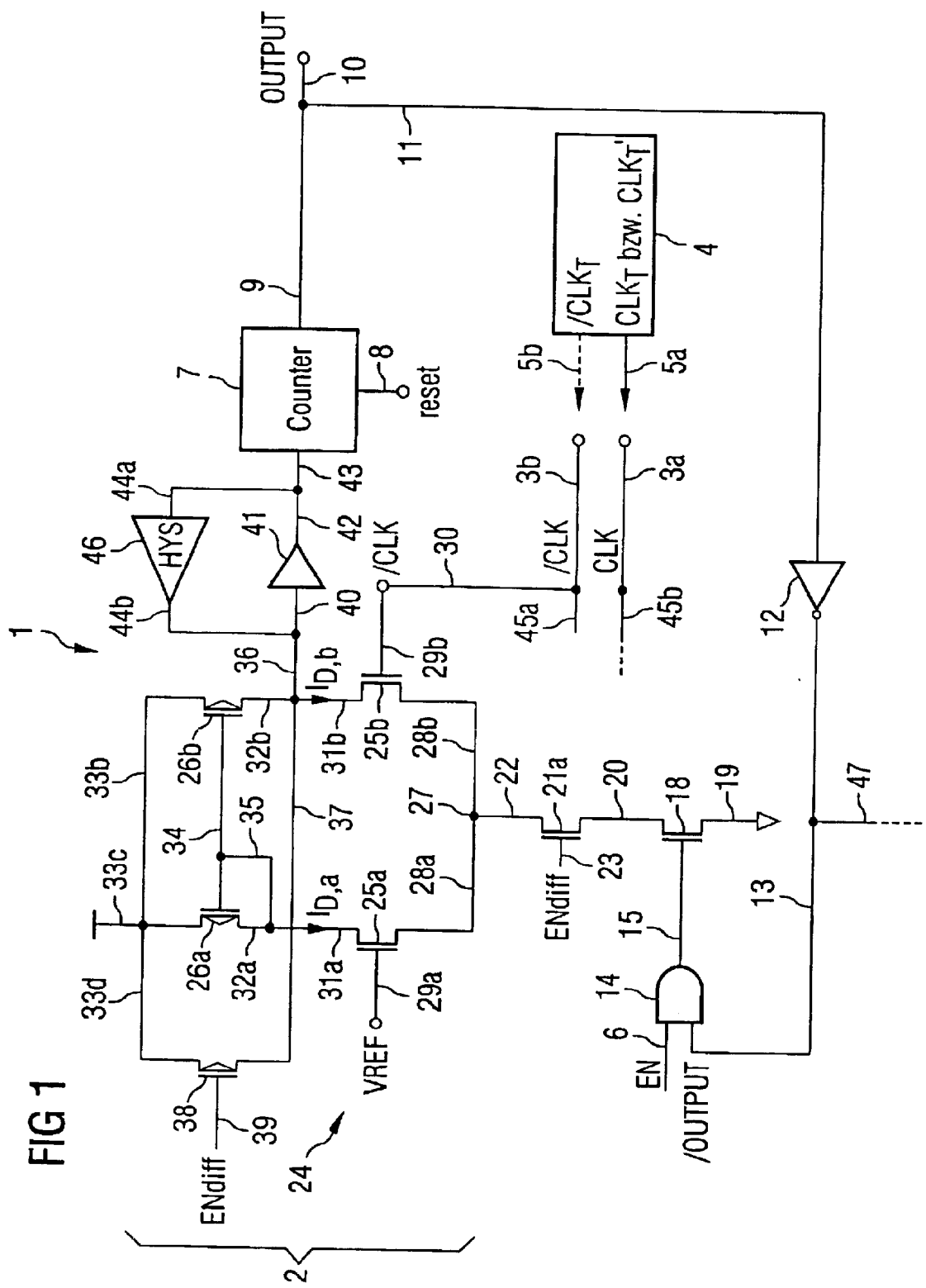
FIG. 1 shows a schematic representation of the first section of a circuit device with one clock pulse detection device according to the embodiment example of the present invention.

In FIG. 1 a schematic representation of a first section of a circuit device 1 is shown with a clock pulse detection device 2 according to the embodiment example of the present invention.

The circuit device 1 may for instance be built into a semi-conductor component—for instance a DRAM memory component (DRAM=Dynamic Random Access Memory and/or dynamic Read/Write Memory) based on CMOS technology.

The DRAM memory component may be a DDR-DRAM (DDR-DRAM=Double Data Rate—DRAM and/or DRAM with double data rate).

The component has two pulse connections 3a, 3b, with which—in the normal operating mode of the DDR-DRAM—a first clock pulse CLK from an external (i.e. an outside) clock pulse trigger—is applied to the first pulse connection 3a—and a second clock pulse /CLK from the same external (outside) trigger to the second pulse connection 3b.

These two clock pulses, CLK and /CLK, for instance refer to so-called differential, i.e. inverse clock pulses: for instance, whenever the first clock pulse CLK changes its state from "high logic" to "low logic", the second clock pulse /CLK—essentially simultaneously—changes its state from "low logic" to "high logic".

Conversely, the second clock pulse /CLK—essentially simultaneously—changes its state from "high logic" to "low logic" whenever the first clock pulse CLK changes from a "low logic" to a "high logic" state.

The above double data rate (in contrast to conventional components using only a single clock pulse CLK) is attained in a DDR-DRAM when the relevant data—within the DDR-DRAM—is not only relayed by the ascending pulse flank of a clock pulse (e.g. of the above single ended clock pulse CLK), but also by the descending flank of the clock pulse CLK—i.e. twice as frequently as in conventional DRAMs using the single ended clock pulse CLK.

When the DDR-DRAM is operated in a test mode (during which the DRAM is for instance being tested by a special external test apparatus 4) instead of in the above normal operation mode, the relevant clock pulses are applied by the external test device 4, instead of by the above external clock pulse trigger.

Hereby the test apparatus 4 can either emit the differential test clock pulses $CLK_T$, $/CLK_T$—corresponding with the differential clock pulses CLK, /CLK—(whereby the first test clock pulse $CLK_T$, corresponding with the above first clock pulse CLK, is applied to the first pulse connection 3a via a first line 5a, and a second test clock pulse $/CLK_T$ (corresponding with the second pulse /CLK) to connection 3b via a second line 5b (shown hatched in FIG. 1) and occasionally inverted in relation to the first test clock pulse $CLK_T$ applied by the test apparatus 4).

Alternatively, the test apparatus 4 can simply emit one single ended test clock pulse $CLK_T$, (corresponding with a current component using one single clock pulse CLK ("single ended" clock pulse)). This single test clock pulse $CLK_T$ is then—as shown in FIG. 1—applied to the first pulse connection 3a of the component via the above first line 5a. (At the second component connection 3b there will then be no (test) clock pulse).

By using one single test clock pulse $CLK_T$ (instead of the above two inverted, differential test clock pulses $CLK_T$, $/CLK_T$), four test channels can be saved with this test device, and/or it can be used to test DDR-DRAMs (essentially) designed to use differential clock pulses, to test currently available test components using one single ended clock pulse (or a test apparatus correspondingly similar to this test device 4, or a slightly modified test device for instance).

As shown in FIGS. 1 and 3, the first pulse connection 3a is connected via a line 45b—and a line 53 connected to it—to a first input of a first pulse relay device 51, and the second pulse connection 3b via a line 45a to a second input of the first pulse relay device 51.

Furthermore, a second pulse relay device 50 has been provided, of which (the only) input—via a line 52, connected to line 45b—is likewise connected to the first component pulse connection 3a.

Regarding FIG. 3, a first output of the first pulse relay device 51 is connected to line 58b, and a second output of the first pulse relay device 51 to a line 58a.

The (only) output of the second pulse relay device 50 is connected to the output of a transmission gate 49 via a line 54 and a line 55 linked to it. The output of the transmission gate 49 is connected to a line 57b (that may be connected to the corresponding line 58b (provided for the first pulse relay device 51).

As further shown in FIG. 3, the (only) output of the second pulse relay device 50 is connected via line 56—which is also linked to line 54—with a first input of a NAND switching link 48, of which the output is connected to a line 57a (which may be connected to the corresponding line 58a provided in the first pulse relay device 51).

As is illustrated more clearly below, the clock pulse detection device 2, shown in FIG. 1, determines whether there are differential clock pulses present at the component, more particularly at one of the pulse connections 3a, 3b—(more particularly the above pulse and/or test clock pulse CLK and/or $CLK_T$ at the first pulse connection 3a, and the above—inverted in relation to these—pulse and/or test clock pulse /CLK and/or $/CLK_T$ at the second pulse connection 3b), or one single-ended clock pulse (more particularly—at the first pulse connection 3a—the above single pulse and/or single test clock pulse CLK and/or $CLK_T$).

If it is detected that there are differential clock pulses present at the circuit device 1, this is indicated by the signal OUTPUT present at the output 10 changing from a "low logic" to a "high logic" state (and a corresponding negated signal/OUTPUT on a line 47 changing from a state of "high logic" to a state of "low logic").

Depending on whether it is determined if there is one single pulse and/or single test clock pulse present, or that there are differential pulses and/or test clock pulses present at the component, i.e. depending on the state of the OUTPUT signal at output 10 of circuit device 1, the second pulse relay device 50 (specially incorporated for single clock pulses), or the first pulse relay device 51 (specially incorporated for differential clock pulses) is activated (and the other pulse relay device 50, 51 present at any time, is deactivated).

When the first pulse relay device 51 has been activated, and the second pulse relay device 50 deactivated ("high logic" state of the OUTPUT signal at output 10 of the circuit device 1), the first pulse relay device 51 applies the differential clock pulses (and/or test clock pulses) CLK''', /CLK'''—derived from differential clock pulse CLK, /CLK (and/or $CLK_T$, $/CLK_T$) received on lines 45a, 53—to lines 58a, 58b (more particularly one clock pulse CLK''' to line 58b, and one—inverted hereto—clock pulse /CLK''' to line 58a).

The clock pulses CLK''', /CLK'''—in contrast to the dock pulse CLK, /CLK (and/or $CLK_T$, $/CLK_T$)—are correspondingly "primed" by the first pulse relay device 51, for instance re-timed and/or re-shaped and/or re-amplified and are relayed to other circuit devices incorporated in the component, for the chronological co-ordination of the processing and/or relaying of data in the component.

If however the second pulse relay device 50 has been activated, and the first pulse relay device 51 deactivated (a "low logic" state of the signal OUTPUT at output 10 of the circuit device 1), the second pulse relay device 50 emits one clock pulse CLK"" derived from the (single) clock pulse (and/or (single) test clock pulse) CLK on line 52 to the (single) line 54.

The clock pulse CLK""—in contrast to the clock pulse CLK—has been correspondingly "primed" by the second pulse relay device 50, i.e. re-timed and/or re-shaped and/or re-amplified.

As shown in FIG. 3, the clock pulse CLK"" is relayed via line 56 to the first input of the NAND switching element 48. If there is a "high logic" signal present at the second input of the NAND switching member 48 (i.e. on line 47) (i.e. with a "low logic" state of the signal OUTPUT at output 10 of the circuit device 1), a clock pulse /CLK"—inverted in relation to clock pulse CLK""—is emitted at the output of the NAND switching member 48, i.e. on line 57a, to retard the propagation delay time $t_{pd,NAND}$ of the NAND switching link 48.

As further shown in FIG. 3, the clock pulse CLK"" is furthermore applied via line 55 to the input of the transmission gate 49.

This contains an n and a p channel field effect transistor, whereby the first control input of the transmission gate 49 is connected to a gate of the n channel field effect transistor and the second, complementary control input of the transmission gate 49 has been connected to the gate of the p channel field effect transistor.

The—interconnected—drains of the n and of the p channel field effect transistors constitute the input, and the—similarly interconnected—sources of the n and of the p channel field effect transistors constitute the output of the transmission gate 49.

According to FIG. 3 a "high logic" signal (and so too a "low logic" signal at the second, complementary control input of the transmission gate 49) is constantly applied to the first control input of the transmission gate 49, so that the transmission gate is constantly in a conductive state.

The clock pulse CLK"" present at the input of the transmission gate 49 is thereby relayed—essentially unmodified and simply retarded by the propagation delay time $t_{pd,TRANSMISSION}$ of the transmission gate 49—to the output transmission gate 49, so that there is one—delayed—clock pulse CLK" present at line 57b.

The propagation delay time $t_{pd,TRANSMISSION}$ of the transmission gate 49 is essentially equal to the propagation delay time $t_{pd,NAND}$ of the NAND switching link 48.

This has the effect that the clock pulse /CLK" at the output of the NAND switching member 48, i.e. on line 57a, is inverted in relation to the clock pulse CLK" emitted at the output of the transmission gate 49, i.e. on line 57b. In other words, differential clock pulses CLK", /CLK" are present on lines 57a, 57b—similar to the differential clock pulses CLK'", /CLK'" that are correspondingly emitted by the first pulse relay device 51 on lines 58a, 58b—from where they are relayed to circuit devices in the component foreseen above, for the chronological co-ordination of the processing and/or relaying of data.

Because there is only one (single) internal "CLK line" (here: the pulse line $CLK_i$, and one (single) internal "/CLK-line" (here: the pulse line $/CLK_i$) provided in the components at any one time, a circuit device 59 relays either the signals CLK'" and /CLK'" present on lines 58a, 58b, or the signals CLK" and /CLK" present on lines 57a, 57b, to the internal pulse line $CLK_i$ and/or the internal pulse line $/CLK_i$, depending on the result of the dock pulse detection done by the clock pulse detection device 2.

As stated above, it is determined by means of the clock pulse detection device 2 shown in FIG. 1, whether there are differential clock pulses or one single-ended clock pulse present at the component—more particularly at one of its pulse connections 3a, 3b—so that either the first or the second pulse relay device 50, 51 can be correspondingly activated.

It is also detected whether the above clock pulse /CLK and/or test clock pulse $/CLK_T$ are present at the second pulse connection 3b or not.

From the fact that the above clock pulse /CLK and/or test clock pulse $/CLK_T$ is present at the second pulse connection 3b, it can be determined that there are differential clock pulses present at the whole component, more particularly at its pulse connections 3a, 3b.

In contrast to this, from the fact that there is no clock pulse /CLK and/or test clock pulse $/CLK_T$ present at the second pulse connection 3b, it can be determined that there is one single-ended clock pulse present at the component, more particularly at its first pulse connection 3a.

When the DDR component is put into operation (i.e. when the component changes from a state "power off" to a state of "power on"), the circuit device 1 is enabled. For this, a "high logic" circuit device enabling signal EN is applied to line 6 (and/or the circuit device enabling signal EN changes its state from "low logic" to "high logic").

When the DDR component is put into operation, the counter position Z of a counter device 7 (here: a dual counter) is also reset to a starting position (here: a counter initial value $Z_0=0$). For this a "high logic" counter clearing signal RESET is—momentarily—applied (and/or the counter reset signal changes its state from "low logic" to "high logic" (and then back again from "high logic" to "low logic")).

The counter device 7 is constructed in such a way that it emits a "low logic" signal at the output of the counter device 7 when it shows a reading Z of "zero" (i.e. at a counter starting value of $Z_0=0$).

The output of counter device 7 is connected to output 10 of the circuit device I via line 9 (at which a "low logic" signal OUTPUT is also emitted).

Apart from being connected to output 10 of circuit device 1, line 9 (and thus also the output of the counter device 7) is also connected to the input of an inverter 12.

When—as described above—a "low logic" signal is emitted and relayed via lines 9 and 11 to the input of the inverter 12,—after the DDR component is put into operation and the counter device 7 has been reset,—the inverter emits an inverted, i.e. "high logic" signal /OUTPUT.

The "high logic" signal /OUTPUT is relayed via a line 13 to a first input of an AND switching member 14, as well as to a NAND switching link 48 shown in FIG. 3 via line 47.

As shown in FIG. 1, the above circuit device enabling signal EN is applied to the second input of the AND switching link 14 via line 6.

Only when (as is the case after putting the DDR component into operation and resetting the counter device 7) a "high logic" state exists at the AND switching member 14 as well as at the signal /OUTPUT,—relayed via line 13—as well as at the circuit device enabling signal EN—relayed via line 6—is a "high logic" signal emitted by the output of the AND switching member 14, which is relayed to the gate of an n channel field effect transistor 18 (here: an n channel MOSFET 18).

As further shown in FIG. 1, the drain of the n channel field effect transistor 18 is connected to the supply voltage via line 19, and the source via a line 20 to the drain of another n channel field effect transistor 21 (here: an n channel MOSFET 21) connected in series with the n channel field effect transistor 18.

When—as described above—a "high logic" signal is emitted at the output of the AND switching member 14, the n channel field effect transistor 18 is switched on and/or through; then the voltage at the source of the n channel field effect transistor 18 is essentially equal to the voltage at its drain (here: GROUND potential).

The drain of the n channel field effect transistor 21 is connected via a line 22 to the actual clock pulse detection device 2 (connected in series with the n channel field effect transistor) of the circuit device 1, more particularly to a connection 27 of a differential amplifier 24.

The gate of the n channel field effect transistor 21 is connected to a line 23. When the DDR component is put into operation (i.e. when the component changes from a state of "power off" to a state of "power on"), it becomes possible for a "high logic" differential amplifier enabling signal ENdiff to be applied via line 23 to the gate of the n channel field effect transistor 21.

If there is a "high logic" differential amplifier enabling signal ENdiff present at the gate of the n channel field effect transistor 21, then the n channel field effect transistor 21 is switched on and/or through; the voltage at the drain of the n channel field effect transistor 21—and also the voltage at the differential amplifier connection 27—is essentially as large as the voltage at the source of the n channel field effect transistor 21, and then—with a switched on and/or through-connected n channel field effect transistor 18—also essentially as large as the voltage at the source of the n channel field effect transistor 18 (here: GROUND potential).

In this state, the differential amplifier 24 and/or the clock pulse detection device 2 are "enabled", i.e. a comparison is made by the differential amplifier 24 and/or the clock pulse detection device 2—in the manner described in detail below—between the reference voltage VREF and the voltage of the clock pulse /CLK and/or test clock pulse /CLK$_T$.

If, in contrast to this, there is a "low logic" instead of a "high logic" signal present, either at the gate of the n channel field effect transistor 21 and/or at the gate of the n channel field effect transistor 18, the n channel field effect transistor 21 and/or the n channel field effect transistor 18 are switched off and/or blocked.

Due to the voltage drop between the drain and the source of the corresponding channel field effect transistor 18 and/or 21, the voltage at the source of the n channel field effect transistor 21—and therefore also the voltage at the differential amplifier connection 27—will (necessarily) not be at GROUND potential any longer.

In this state, as is more clearly illustrated below, the differential amplifier 24 and/or the clock pulse detection device 2 can then make no representation based on a relevant comparison between the voltage level of the clock pulse /CLK and/or test clock pulse /CLK$_T$ and the reference voltage VREF; the differential amplifier 24 and/or the clock pulse detection device 2 are then "blocked".

As shown in FIG. 1, the differential amplifier 24 has two symmetrical n channel field effect transistors 25a, 25b connected in parallel (here: two n channel MOSFETs 25a, 25b), as well as two p-channel field effect transistors 26a, 26b (here: two p-channel MOSFETs 26a, 26b)—operating as active, high-resistance loads for the differential amplifier 24 and/or the n channel field effect transistors 25a, 25b.

The source of the first n channel field effect transistor 25a of the differential amplifier 24 is connected to the differential amplifier connection 27 (and thus also to the source of the n channel field effect transistor 21) via a line 28a.

In corresponding, symmetrical fashion the source of the second n channel field effect transistor 25b of the differential amplifier 24 is also connected to the differential amplifier connection 27 (and thus also to the source of the n channel field effect transistor 21), in fact via a line 28b.

The gate of the first n channel field effect transistor 25a is connected to a first input of the differential amplifier 24 via a line 29a, and the gate of the second n channel field effect transistor 25b to a second differential amplifier input via a line 29b.

The second differential amplifier (input line 29b) is connected to the second pulse connection 3b of the DDR-DRAM via a line 30 (where, as illustrated above—in normal working operational mode—the above first, differential clock pulse /CLK is present, or—in test mode—either (where differential test dock pulses are used) the above first, differential test clock pulse /CLK$_T$, or (where a single test clock pulse is used) no (test pulse) signal is present.

The above reference voltage VREF is applied to the first differential amplifier input line 29a). The reference voltage is derived from the supply voltage, for instance by means of a voltage divider. The voltage level of the reference voltage VREF remains constant—as shown in FIG. 2—and may for instance amount to ca. half the level of the supply voltage.

In contrast to this—as also shown in FIG. 2—the voltage of the (test) clock pulse /CLK and/or /CLK$_T$ that may be present at the second differential amplifier input (line 29b), varies at regular chronological intervals between a voltage value of 0V (ground voltage), and the level of the supply voltage (i.e. essentially double the level of the reference voltage VREF).

Again referring to FIG. 1, the drain 25b of the second n channel field effect transistor at the differential amplifier 24, is connected via a line 31b to a differential amplifier-output, which is connected to an output line 36.

Both the differential amplifier outputs (line 31a, and lines 31b and/or 36) are—as is self-evident—connected at any one time to the above-mentioned p-channel field effect transistors 26a, 26b acting as active, high-resistance loads to the differential amplifier 24 and/or the n channel field effect transistors 25a, 25b.

Furthermore, the second differential amplifier output (lines 31b and/or 36)—and thereby also the source of the second n channel field effect transistor 25b—are connected via a line 32b to the source of the second p-channel field effect transistor 26b.

In similar fashion the first differential amplifier output (line 31a)—and thereby also the drain of the first n channel field effect transistor 25a—is connected via line 32a to the source of the first p-channel field effect transistor 26a.

The source of the second p-channel field effect transistor 26b is connected to the supply voltage via a line 33b connected to a line 33c; in similar manner the source of the first p channel field effect transistor 26a is also connected to the supply voltage (via a line 33a, which is also connected to the line 33a, which is in turn connected to the supply voltage).

As can be further seen from FIG. 1, the gates of both p channel field effect transistors 26a, 26b are connected to each other via a line 34, and via a line 35 to the line 32a (and thereby to the drain of the first p-channel field effect transistor 26a and the drain of the first n channel field effect transistor 25a).

By means of the p channel field effect transistors 26a, 26b (connected as shown above)—operating as active, high-resistance loads—it is made possible for both—symmetrical—n channel field effect transistors 25a, 25b to be operated in the saturation range.

The bigger the differential between the voltage level of the (test-) clock pulse /CLK and/or /CLK$_T$ present at the second differential amplifier input (line 29b), and the level of the reference voltage VREF present at first differential amplifier input (line 29a), the bigger is the drain current $I_{D,b}$ flowing through the second n channel field effect transistor 25b (and/or the smaller is the drain current $I_{D,a}$ flowing through the first n channel field effect transistor 25a), and the lower is the voltage at the second differential amplifier output (line 31b and/or output line 36) (and/or the higher is the voltage at the first differential amplifier-output (line 31a)).

Thereby (and due to the corresponding levels of the resistances acting as high-resistance loads for the p-channel field effect transistors 26a, 26b, operating as n channel field effect transistors 25a, 25b) the sum of the drain currents $I_{D,a}$, $I_{D,b}$ flowing through both the n channel field effect transistors 25a, 25b remains essentially constant (i.e. in essence $I_{D,a}+I_{D,b}$=const.).

As further shown in FIG. 1, the second differential amplifier-output (line 31b and/or output line 36) is connected via a line 37 to the source of a further p channel field effect transistor 38, of which the source is connected via a line 33d to line 33a (and thereby via line 33c to the supply voltage potential), and of which the gate is connected to a line 39, at which the above differential amplifier-enabling signal ENdiff is present, just as it is at the gate of the n channel field effect transistor 21.

If—for instance as is the case after putting the DDR components into operation—the differential amplifier-enabling signal ENdiff is "high logic", the further p channel field effect transistor 38 is switched off and/or blocked, i.e. has no influence on the voltage present at the second differential amplifier-output line 31b and/or output line 36 (instead of this it depends, as described above, on the difference between the level of the voltage of the (test) clock pulse /CLK and/or /CLK$_{T,and}$ at the second differential amplifier input (line 29b) and the level of the reference voltage VREF present at the first differential amplifier input (line 29a).

If however, a "low logic" signal instead of a "high logic" signal is present at the gate of the further p channel field effect transistor 38 (and accordingly also at the gate of the n channel field effect transistor 21), the p-channel field effect transistor 38 is switched on and/or through (and accordingly the n channel field effect transistor 21 is switched off and/or blocked). The voltage at the second differential amplifier-output (line 31b and/or output line 36) is then (necessarily) lifted to that of the supply voltage potential. The voltage present at the second differential amplifier output then does not depend on the difference between the level of the voltage of the (test) clock pulse /CLK and/or /CLK$_T$ present at the second differential amplifier input (line 29b) and the level of the reference voltage VREF present at the first differential amplifier input (line 29a); the differential amplifier 24 and/or the clock pulse detection device 2 are "blocked".

As further shown in FIG. 1, the second differential amplifier output (line 31b and/or output line 36) are connected via line 40 to the input of an inverter amplifier 41. The output of the inverter amplifier 41 is connected via a line 42 to a line 43, which is connected to the input of the counter device 7.

Furthermore, the line 42 connected to the inverter amplifier output—via a line 44a—is connected to a further inverter amplifier 46, which is connected—via a line 44b—to line 40 (and thereby to the input of the inverter amplifier 41). The output of the inverter amplifier 41 is also back-connected to the inverter amplifier input, with the further inverter amplifier 46 interposed.

Each of the inverter amplifiers 41 and 46 consists at any one time of an n and a p channel field effect transistor, in which the source of the respective n channel field effect transistor is at any time connected to ground, and the source of the respective p channel field effect transistor at any time to the supply voltage.

The field effect transistors used in the inverter amplifiers 41, 46 therefore also always operate in source circuit, and amplify the input voltage present at the respective inverter input inversely, whereby a field effect transistor of one inverter amplifier 41, 46 always constitutes the operating resistance for the other field effect transistor.

Due to the above back-connection—and a corresponding dimensioning of the additional inverter amplifier 46—it is here achieved (in recognized fashion) that the switching on and switching off voltage levels of the inverter amplifier 41 do not coincide, but differ by reason of an inverter amplifier switching hysteresis $\Delta U_e$;

Only when the level of the voltage at the second differential amplifier output line 31b and/or output line 36)—and therewith the level of that voltage at the input of the inverter amplifier 41—fall below a value $U_{e,aus}$ is that inverter amplifier 41 "switched off"; at the output of the inverter amplifier 41 there will then for instance be a "high logic" (and/or "low logic") signal present (here: the supply voltage potential and/or ground potential).

In contrast to this it is only when the level of the voltage at the second differential amplifier-output (line 31b and/or output line 36)—and thereby the level of the voltage at the input of the inverter amplifier 41—(again) exceed a value $U_{e,ein}$ (and not already at the value $U_{e,aus}$), that the inverter amplifier is (again) "switched on"; at the output of the inverter amplifier 41 there will then for instance be a "low logic" (or "high logic") signal present (here: the ground potential and/or the supply voltage potential). Consequently $U_{e,aus}$ is smaller than $U_{e,ein}$, i.e. $U_{e,aus}-U_{e,ein}=\Delta U_e$ (switching hysteresis of the inverter amplifier 41) applies.

Consequently, differing upper and lower switching points—as illustrated in FIG. 2—occur at the clock pulse detection device 2 depending on the level of the voltage of the (test) clock pulse /CLK and/or /CLK$_T$ present at the second differential amplifier input (line 29b), and on the level of the reference voltage VREF present at the first differential amplifier input (line 29a), as well as on the—resulting—level of the voltage present at the output of the inverter amplifier 41 (clock pulse detection device switching hysteresis $\Delta U_{total}$):

Only when the level of the voltage of the (test) dock pulse /CLK and/or /CLK$_T$present at the second differential amplifier input (line 29b) is higher than the level of the reference voltage VREF (plus a hysteresis $\Delta U_1$) present at the first differential amplifier input (line 29a), (i.e. only when the following applies:

/CLK>(VREF+$\Delta U_1$)

(and/or /CLK$_T$>(VREF+$\Delta U_1$)), is that inverter amplifier 41 "switched off" (and is there then a "high logic" signal present at the output of the inverter amplifier 41).

In contrast, only when the level of the voltage of the (test) clock pulse /CLK and/or /CLK$_T$ present at the second differential amplifier input (line 29b) is (again) lower than the level of the reference voltage VREF present at the first differential amplifier input (line 29a), minus a hysteresis $\Delta U_2$ (i.e. only when the following applies:

/CLK<(VREF-$\Delta U_2$)

(and/or /CLK$_T$<(VREF−ΔU$_2$)), is the inverter amplifier 41 (again) "switched on" (is there then a "low logic" signal present at the output of the inverter amplifier 41).

Therefore the following applies to the above (total) switching hysteresis of the clock pulse detection device 2:

$$\Delta U_{total} = (VREF + \Delta U1) - (VREF - \Delta U_2)$$

As mentioned above, the signal present at the output of the inverter amplifier 41 is relayed via lines 42, 43 to the input of the counter device 7.

Every time the signal present on lines 42, 43 changes its state first from "low logic" and then back again to "high logic", does the counter reading Z—which, as mentioned above during the putting into operation of the DDR components, was first reset to a reading Z of "zero" (i.e. a initial counter reading value of $Z_0=0$)—as shown in FIG. 2—does the reading Z of the counter device 7 increase by "one" (i.e. with the first negative pulse flank of the (test) clock pulse /CLK and/or /CLK$_T$ it changes from "zero" to "one", with the next negative pulse flank of the (test) clock pulse /CLK and/or /CLK$_T$ from "one" to "two", etc.)

By means of the hysteresis $\Delta U_{total}$ of the clock pulse detection device 2 illustrated above, it can be prevented that even relatively small fluctuations—simply due to interference—between the levels of the (test) clock pulse /CLK and/or /CLK$_T$ and the reference voltage VREF present at the inverter amplifier (line 29a), can—erroneously—switch over the first differential amplifier 41 and increase the counter reading Z of the counter device 7.

As illustrated above, the counter device 7 first (e.g. with a counter reading of Z "zero", i.e. with an initial counter reading value $Z_0=0$)) emits a "low logic" signal at the output of the counter device 7. Only when the counter reading Z reaches a predetermined value of $Z_{vor}$, does the counter device 7—emit a "high logic" instead of a "low logic" signal—so that the signal OUTPUT at the output 10 of the circuit device 1 changes its state from "low logic" to "high logic".

The predetermined counter reading $Z_{vor}$, at which the signal emitted by counter device 7 changes its state from "low logic" to "high logic", may for instance lie "two" and "sixty four" (i.e. $2<Z_{vor}<64$), more particularly between "eight" and "thirty two" (i.e. $8<Z_{vor}<32$ equal to "sixteen" (i.e. $Z_{vor}=16$).

Each time the counter reading Z is increased by "one" it can be assumed that—as shown in FIG. 2—one (further) single pulse S1, S2, S3, S4 of a (test) clock pulse /CLK and/or /CLK$_T$ present at the second pulse connection 3b has been detected.

When the counter reading Z reaches the above predetermined counter reading value $Z_{vor}$ (and it is likely that a relatively high number (here e.g. $Z_{vor}=16$) of single pulses S1, S2, S3, S4 has been detected) it can be assumed that the (test) clock pulse /CLK and/or /CLK$_T$ is present at the second pulse connection 3b (and consequently that at the whole component—more particularly at one of its pulse connections 3a, 3b—there are differential clock pulses present (more particularly the above pulse and/or test clock pulse CLK and/or CLK$_T$ at the first pulse connection 3a, and the above—inverted thereto—pulse and/or test clock pulse /CLK and/or /CLK$_T$ at the second pulse connection 3b)).

This is indicated—as illustrated—by the signal OUTPUT at output 10 of circuit device 1 assuming a "high logic" state.

If however the counter reading Z of the counter device 7 remains at the initial value $Z_0=0$, or if the counter reading Z remains below the predetermined counter reading value $Z_{vor}$, it can be assumed that there is no (test) clock pulse /CLK and/or /CLK$_T$ present at the second pulse connection 3b (and that there is one single ended clock pulse, the above single pulse and/or single test clock pulse CLK and/or CLK$_T$, present at the component as a whole (more particularly at the first pulse connection 3a)).

If it is detected that there are differential clock pulses present at the component—and the counter device 7 one emits a corresponding "high logic" signal—this "high logic" signal is relayed via lines 9 and 11 to the input of the inverter 12.

The inverter 12 then emits one inverted, i.e. "low logic" signal /OUTPUT at its output.

This "low logic" signal /OUTPUT is led via line 13 to the first input of the AND switching member 14, whose output (i.e. line 15) then emits a "low logic" signal, applied to the gate of the n channel field effect transistor 18. This causes the n channel field effect transistor 18 to be switched out and/or off (i.e. to become non-conductive)—the differential amplifier 24 and/or the clock pulse—detection device 2 are—as also illustrated above—then "blocked" and/or switched off.

This prevents an unnecessarily high current consumption—i.e. during the application of differential clock pulses—in the normal operating mode.

What is claimed is:

1. A component, with a connection, as well as at least one further connection, in which differential input clock pulses can be applied to the connections, or a single input clock pulse can be applied to the connection and/or to the further connection wherein the component further comprises a first and a second pulse relay device, whereby the first pulse relay device is arranged for relaying differential input clock pulses, and the second pulse relay device for relaying a single input clock pulse.

2. A component according to claim 1, in which the first pulse relay device is specially arranged for relaying differential input clock pulses, and/or the second pulse relay device is specially arranged for relaying a single-input-clock pulse.

3. A component according to claim 1, in which the second pulse relay device then induces the emission of a differential output clock pulse on a corresponding pair of lines, when it is detected that there is a single input clock pulse present at connection and/or at the further connection.

4. A component according to claim 3, which also contains a circuit device to detect whether differential input clock pulses are present at the connections, or a single-input-clock pulse at connection and/or at the further connection.

5. A component according to claim 4, whereby the circuit device determines whether an input-clock pulse is present at the connection and/or at the further connection, in order to determine whether differential input clock pulses are present at the connections, or whether a single-input-clock pulse is present at the connection and/or at the further connection.

6. A component according to claim 5, in which the circuit device contains a comparison device for comparing signals present at the connection, more particularly input-clock pulses, with a reference signal.

7. A component according to claim 6, in which the comparison device contains a differential amplifier.

8. A component according to claim 7, in which the comparison device then emits an impulse, more particularly an-input-clock pulse detection signal, when the level of the signal present at the connection exceeds or falls below a predetermined level, more particularly the level of the reference signal.

9. A component according to claim 8, with which an impulse, more particularly an input clock pulse detection signal is then emitted by the comparison device when the level of the signal present at connection first exceeds a predetermined initial level, and then falls below a predetermined second level that differs from the initial level.

10. A component according to claim 8, with which an impulse, more particularly an input clock pulse detection signal is then emitted by the comparison device, when that level of the signal present at connection first falls below a predetermined initial level, and then exceeds a predetermined, second level that differs from the initial level.

11. A component according to claim 10, which furthermore contains a counter device, particularly for detecting the number of impulse, more particularly input clock pulse detection signals emitted by the comparison device.

12. A component according to claim 11, with which it is determined that an input clock pulse is present at connection, when the number of impulses, more particularly input clock pulse detection signals emitted by the comparison device and detected by the counter device, is larger than or equal to a predetermined number.

13. A component according to claim 11, wherein the component is a DDR semi-conductor component, more particularly a DDR semi-conductor memory component.

14. A component according to claim 13, in which the memory component is a DRAM (Dynamic Random Access Memory).

15. A component according to claim 2, in which the second pulse relay device then induces the emission of a differential output clock pulse on a corresponding pair of lines, when it is detected that there is a single input clock pulse present at connection and/or at the further connection.

16. A component according to claim 15, which furthermore contains a counter device, particularly for detecting the number of impulse, more particularly input clock pulse detection signals emitted by the comparison device.

17. A component according to claim 16, with which it is determined that an input clock pulse is present at connection, when the number of impulses, more particularly input clock pulse detection signals emitted by the comparison device and detected by the counter device, is larger than or equal to a predetermined number.

18. A component according to claim 15, which also contains a circuit device to detect whether differential input clock pulses are present at the connections, or a single-input-clock pulse at connection and/or at the further connection.

19. A component according to claim 1, which furthermore contains a counter device, particularly for detecting the number of impulse, more particularly input clock pulse detection signals emitted by the comparison device.

20. A component according to claim 13, wherein the component is a DDR semi-conductor component, more particularly a DDR semi-conductor memory component.

* * * * *